United States Patent
Duron et al.

(10) Patent No.: US 7,454,664 B2
(45) Date of Patent: Nov. 18, 2008

(54) JTAGCHAIN BUS SWITCHING AND CONFIGURING DEVICE

(75) Inventors: Mike Conrad Duron, Pflugerville, TX (US); Robert Allan Faust, Austin, TX (US); Forrest Clifton Gray, Austin, TX (US); Ajay Kumar Mahajan, Austin, TX (US); Glenn Rueban Miles, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 855 days.

(21) Appl. No.: 10/610,170

(22) Filed: Jun. 30, 2003

(65) Prior Publication Data

US 2005/0015669 A1 Jan. 20, 2005

(51) Int. Cl.
*G06F 11/00* (2006.01)
(52) U.S. Cl. .............................. 714/43; 714/27; 714/30; 714/45; 714/51
(58) Field of Classification Search .................. 714/43, 714/27, 30, 45, 51
See application file for complete search history.

(56) References Cited

U.S. PATENT DOCUMENTS

| | | | |
|---|---|---|---|
| 5,345,556 A | 9/1994 | Zapisek | 395/200 |
| 5,428,624 A | 6/1995 | Blair et al. | 371/22.3 |
| 5,450,330 A | 9/1995 | Zapisek | 364/488 |
| 5,454,025 A | 9/1995 | Mulrow et al. | 379/45 |
| 5,498,975 A | 3/1996 | Cliff et al. | 326/10 |
| 5,617,042 A | 4/1997 | Agrawal | 326/39 |
| 5,710,550 A * | 1/1998 | Hsieh et al. | 340/2.26 |
| 5,856,713 A | 1/1999 | Huettner et al. | 307/125 |
| 5,968,196 A | 10/1999 | Ramamurthy et al. | 714/727 |
| 6,006,275 A | 12/1999 | Picazo, Jr. et al. | 709/249 |
| 6,097,218 A | 8/2000 | Callicott et al. | 326/82 |
| 6,304,488 B1 | 10/2001 | Abedifard et al. | 365/185.23 |
| 6,316,933 B1 | 11/2001 | Olson | 324/158.1 |
| 6,373,840 B1 | 4/2002 | Chen | 370/360 |
| 6,425,101 B1 * | 7/2002 | Garreau | 714/727 |
| 6,611,518 B1 * | 8/2003 | Ngo et al. | 370/386 |

OTHER PUBLICATIONS

IBM Technical Disclosure Bulletin, "Logically Controlled Chip Interconnection Technique", vol. 32, No. 3B, Aug. 1989, pp. 294-299.
IBM Technical Disclosure Bulletin, "Enhanced Fault-Tolerance for a Crosspoint Switch", vol. 34, No. 9, Feb. 1992, pp. 473-475.
IBM Technical Disclosure Bulletin, "Electronic Reorganization of Memory for Handling Uncorrectable Memory Errors", vol. 22, No. 12, May 1980, pp. 5378-5380.

* cited by examiner

*Primary Examiner*—Robert Beausoliel
*Assistant Examiner*—Joseph D Manoskey
(74) *Attorney, Agent, or Firm*—Duke W. Yee; Diana R. Gerhardt; Lisa L. B. Yociss

(57) ABSTRACT

Commanding a JTAG bus cross point switching device by the same bus which it configures. Adding, omitting, or rearranging devices on a JTAG bus with a cross point switching device that is included in a JTAG chain. Controlling the switching device with commands on the JTAG bus which it configures.

4 Claims, 4 Drawing Sheets

JTAGCHAIN BUS SWITCHING AND CONFIGURING DEVICE

BACKGROUND OF THE INVENTION

1. Technical Field

The present invention relates generally to bus use or JTAG (Joint Test Action Group) bus use, and particularly to identifying the location of faults on a bus.

2. Description of Related Art

Boundary-scan testing was developed in the mid 1980's to solve physical access problems on printed circuit boards and integrated circuits. Boundary scan, implemented as the JTAG (Joint Test Action Group) interface, embeds test circuitry at the chip level to form a test protocol.

A JTAG bus is a serial bus with four signals: Test Clock (TCK), Test Mode Select (TMS), Test Data Input (TDI), and Test Data Output (TDO). The bus is used for many purposes, including as a test bus for the 'Boundary-Scan' of ICs (integrated circuits), as in Design-For-Testability (DFT). To use JTAG, during the design, JTAG compatible devices must be selected. ICs supporting JTAG will have the four additional pins listed above. Devices reside on the bus in a daisy chain, with TDO of one device feeding TDI of the next device.

FIG. 1 shows a block diagram of a typical system with devices (e.g., integrated circuits or chips) that include JTAG compatible devices 104-112 on JTAG bus 114. Microcontroller 102 controls the circuitry for the JTAG bus 114, and can be implemented on board one or more of devices 104-112. Commands are sent to devices 104-112 through the system 100 by shifting bits through the system on the JTAG bus 114 until the proper command is positioned at the target device (e.g., 112). The controller 102 then causes the devices to latch the data that is positioned before them, using the current bit pattern as a command. In this way, devices on the JTAG bus are issued commands without addressing them.

Some conditions that arise create problems on the single chain that are difficult to analyze. For example, a device on the bus can malfunction and pull one or more of the clock signals (TCK, TMS, TDI, or TDO) low. The bus conductors itself can also be faulty, such as when one or more of the bus conductors becomes shorted to a low impedance source such as ground, or when a break occurs in the bus conductors between chips. It would be advantageous to improve current systems for identifying and isolating faults in such cases in an efficient manner.

SUMMARY OF THE INVENTION

The present invention provides an improved method for controlling devices on a bus, preferably a JTAG bus. Devices arranged on a JTAG bus are accessed through a cross point switch that itself is addressed by commands on the JTAG bus. In other words, no separate bus is necessary to address and command the cross point switch, as the switching device watches the bus and responds to commands issued to it on that bus. The switch is capable of being turned on and off independent of other devices on the bus, and can be used to exclude or include any devices on the bus. The order of devices on the JTAG chain can also be rearranged by the switch. These and other features are described more fully below.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
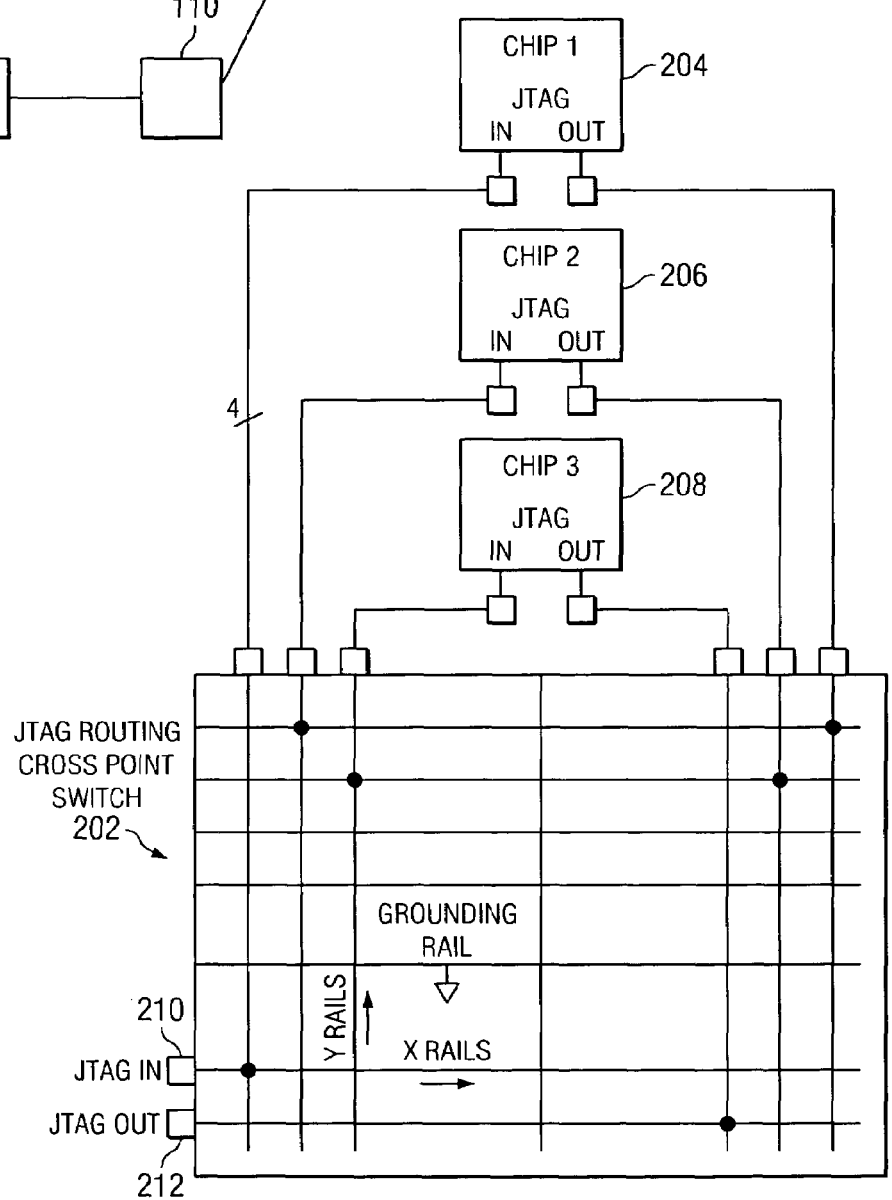
FIG. 2 shows a preferred embodiment of the present invention.

The present invention is described with reference to the drawings. FIG. 2 shows the innovative system 200 including cross point switch 202. Devices 204, 206, 208 are connected to switch 202 such that by connecting particular ones of cross points of switch 202, any of devices 204-208 may be connected to the JTAG bus. JTAG input 210 and output 212 form the entry and exit points for JTAG bus. Commands from the host system are received at input 210, and output from JTAG system 200 is output at JTAG out 212.

Switch 202 is commanded via the JTAG bus which it switches. Hence, no separate bus or addressing mode is required in order to configure JTAG system 200 using switch 202.

Commands issued to switch 202 cause switch 202 to form connections at particular points, which allows switch 202 to arrange all devices on the JTAG bus in any order. Individual devices may be excluded entirely from the chain in this manner. Each individual switch of switch 202 can be turned on or off independent of the other switches and independent of other devices on the bus. By arranging the individual switch states, the devices 204-208 can be put into any order on the bus.

Figure 1:
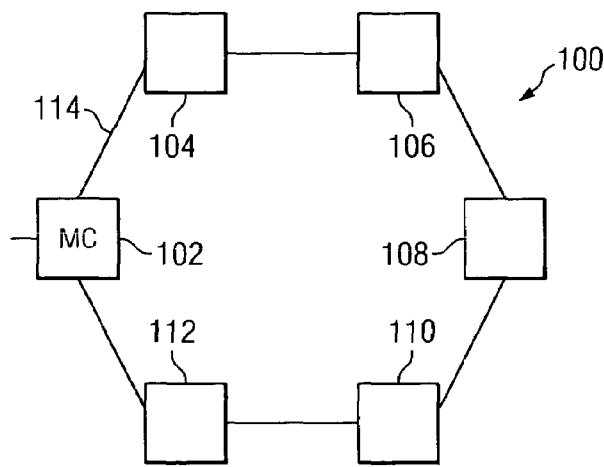
FIG. 1 shows a block diagram of a typical JTAG bus with devices arranged in a chain.
Figure 3:
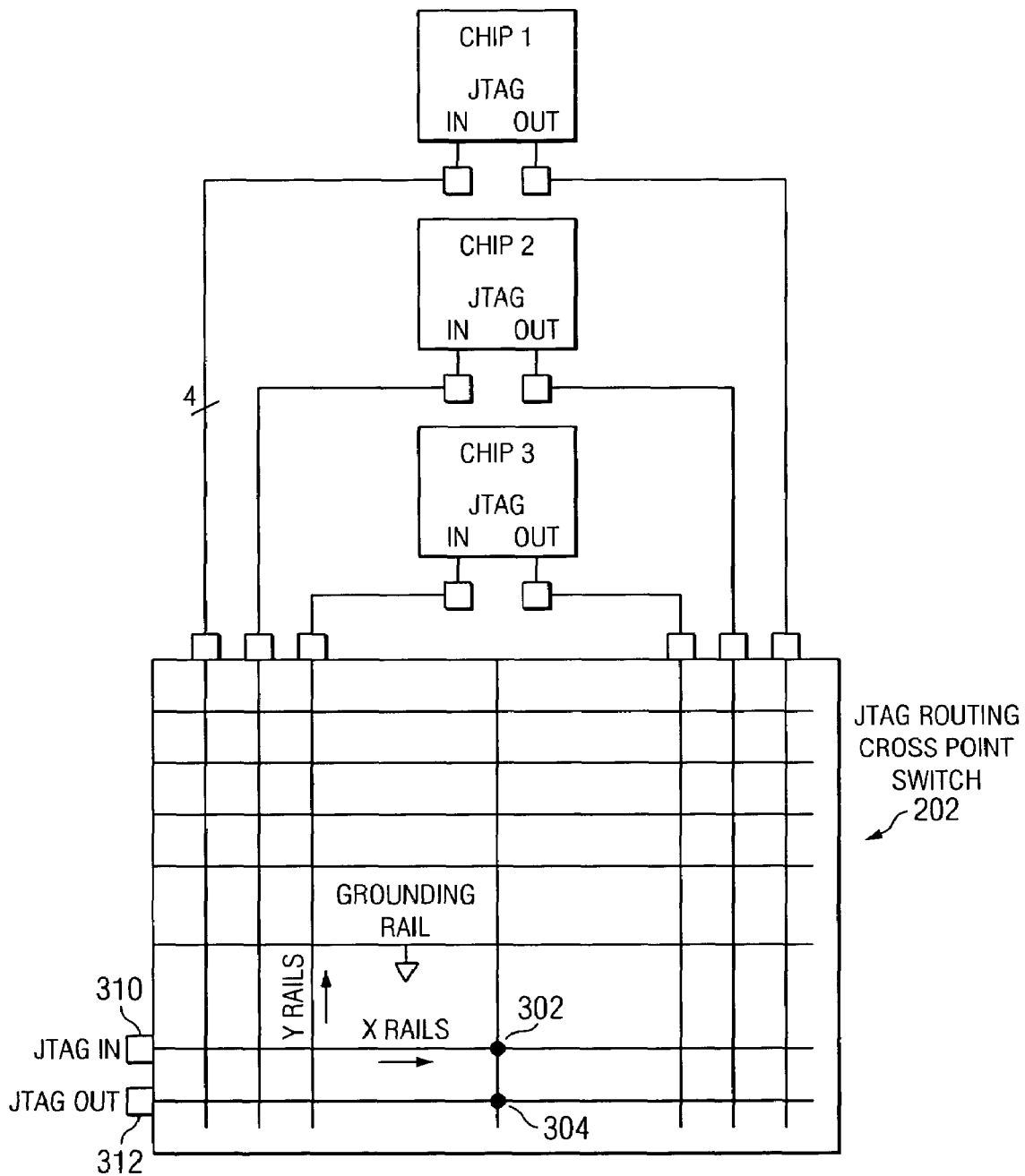
FIG. 3 shows another preferred embodiment of the present invention.

In an example implementation, the operation of the innovative system with cross point switch is described. With reference again to FIG. 2, at power up, the cross point switch 202 comes up with all the devices 204-208 disconnected. The bus driver (e.g., controller 102 from FIG. 1) gives a command to connect devices 1-3 (204-208), which establishes connections as depicted and connects these devices 204-208 to the JTAG bus in the order 1-2-3. When a fault occurs in the system, e.g., devices 204 and 208 fail, the system gives a command to reset all connections, thus removing all devices from the bus. FIG. 3 shows such a configuration. Note the connections 302, 304 form a circuit that shorts the JTAG input 310 and output 312.

Figure 4:
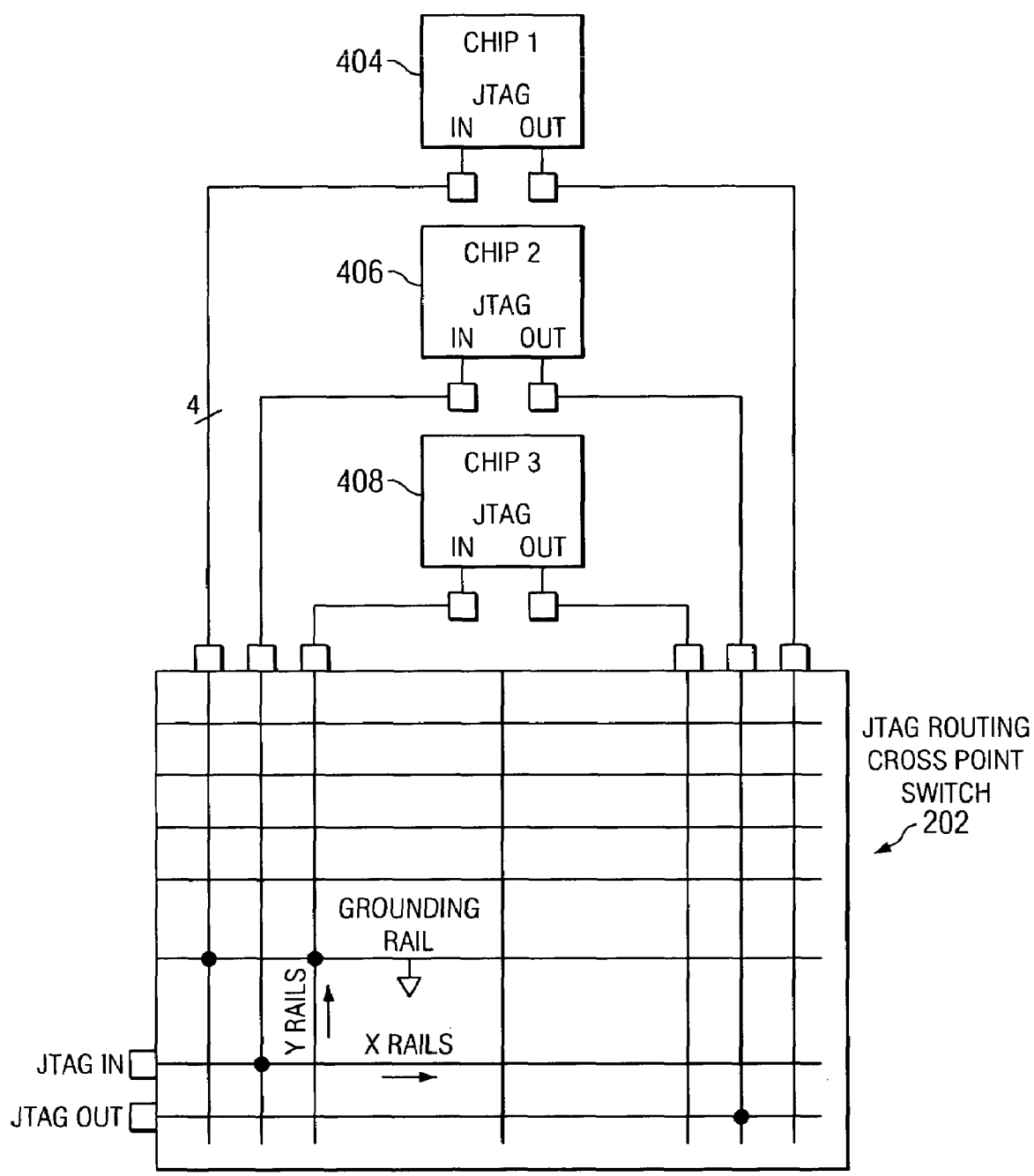
FIG. 4 shows another preferred embodiment of the present invention.

FIG. 4 shows another example configuration. The system then gives a command to reconnect all non-fault devices, and device 406 is reconnected to the bus. Thus, the bus driver only sees device 406 on the JTAG bus. This decreases timing for any future commands as devices 404, 408 are no longer connected, which also decreases the command size.

Figure 5:
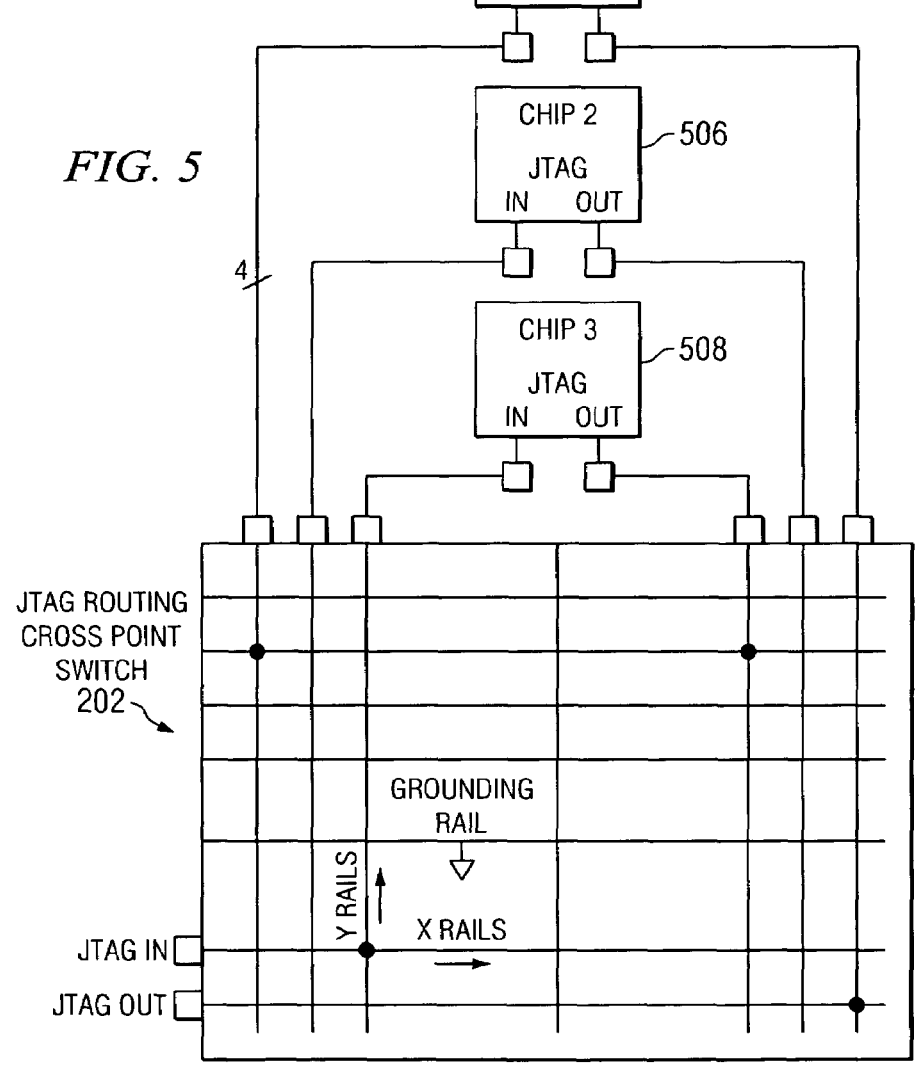
FIG. 5 shows another preferred embodiment of the present invention.

FIG. 5 shows yet another configuration, wherein the order of the devices is rearranged. This allows a user to specify the order in which the devices are seen by the controlling device. In this example, device 506 has been disconnected from the bus, while devices 504, 508 are connected. It is noted that device 508 is seen first in the chain, while device 504 is seen second. This order is reversed from previous configurations.

Figure 6:
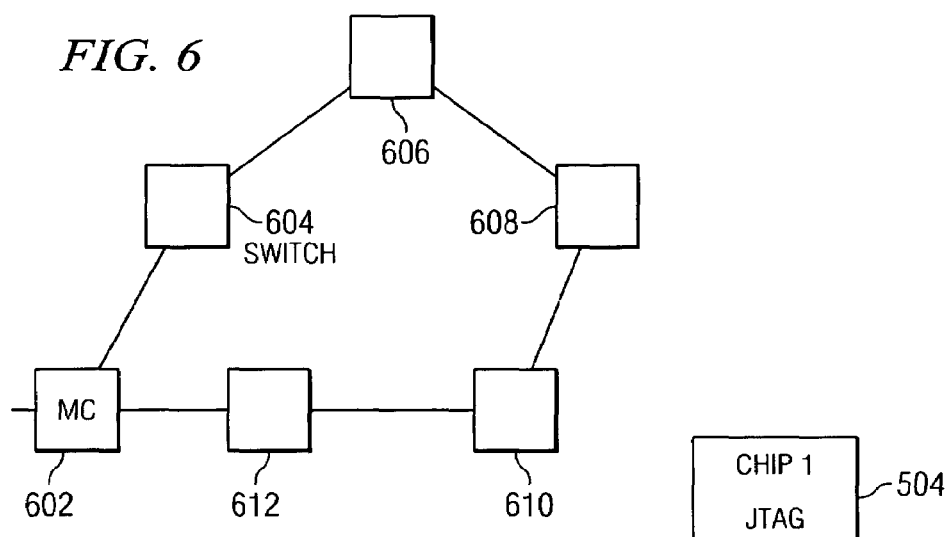
FIG. 6 shows a block diagram of the present invention including cross point switch.

FIG. 6 shows a block diagram of another embodiment of the present invention. The chain of devices (i.e., the complete ring of devices) are all connected to, or capable of being connected to, the bus. In this example, microcontroller 602 receives commands for devices 604-612 on the JTAG chain 600 and issues those signals on the JTAG bus. Switch 604 is one of the devices on JTAG chain 600 and watches the bus and responds to JTAG bus commands issued to it. Other devices 606-612 are configured on the bus according to the switch 604. For example, as described above with respect to FIGS. 2-5, switch 604 can omit or add devices 606-612 to the bus, as well as rearrange the order of these devices on the bus.

Though the present invention has been described with reference to a JTAG bus, which is part of a preferred embodiment of the present invention, the current innovations are not limited to JTAG bus implementations.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, and DVD-ROMs. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of configuring a Joint Test Action Group (JTAG) bus, comprising the steps of:

powering up a cross point switch that is connected to the JTAG bus, wherein the cross point switch responds to commands issued on the JTAG bus, and wherein the cross point switch is configured by a command that is issued on the JTAG bus, and further wherein the switch includes a JTAG input and a JTAG output, and still further wherein a plurality of devices are connected to the JTAG bus;

omitting, by the cross point switch, all of said plurality of devices from the JTAG bus when the cross point switch is powered up;

responsive to the cross point switch being powered up, issuing, by a bus controller that is connected to the JTAG bus, a first command to the cross point switch to connect all of said plurality of devices to the JTAG bus;

connecting, by the cross point switch, all of the plurality of devices to the JTAG bus in response to the first command;

responsive to a fault occurring in one of said plurality of devices, issuing a second command to reset all connections to omit all of said plurality of devices from said JTAG bus;

omitting, by the cross point switch, all of said plurality of devices from the JTAG bus in response to said second command; and shorting the JTAG input and the JTAG output in response to all of said plurality of devices being omitted.

2. The method of claim 1, further comprising the step of when a fault occurs in a second device of the plurality of devices on the bus, issuing a third command to the cross point switch, and wherein the third command configures the switch such that the second device is excluded from the bus.

3. The method of claim 1, wherein the JTAG bus forms a ring.

4. The method according to claim 1, further comprising:

rearranging, by the cross point switch, the order of the plurality of devices on the JTAG bus.

* * * * *